United States Patent
Holland et al.

(10) Patent No.: US 6,233,193 B1
(45) Date of Patent: May 15, 2001

(54) DYNAMIC RANDOM ACCESS MEMORY SYSTEM WITH A STATIC RANDOM ACCESS MEMORY INTERFACE AND METHODS FOR USING THE SAME

(75) Inventors: Walland Bart Holland; Stephen Seitsinger, both of Dallas, TX (US)

(73) Assignee: Silicon Aquarius, Inc.

( * ) Notice: Subject to any disclaimer, the term of this patent is extended or adjusted under 35 U.S.C. 154(b) by 0 days.

(21) Appl. No.: 09/295,641

(22) Filed: Apr. 20, 1999

Related U.S. Application Data

(63) Continuation-in-part of application No. 09/080,813, filed on May 18, 1998, now Pat. No. 5,963,497.

(51) Int. Cl.$^7$ ...................................................... G11C 7/00
(52) U.S. Cl. ...................... 365/222; 365/149; 365/230.06
(58) Field of Search .................................. 365/222, 149, 365/230.06

(56) References Cited

U.S. PATENT DOCUMENTS

| | | | |
|---|---|---|---|
| 4,203,159 | * | 5/1980 | Wanlass ................................ 365/222 |
| 5,007,022 | * | 4/1991 | Leigh ................................ 365/222 X |
| 5,010,519 | * | 4/1991 | Yoshimoto et al. .................. 365/149 |
| 5,377,142 | * | 12/1994 | Matsumura et al. ............. 365/149 X |

OTHER PUBLICATIONS

"Transparent–Refresh DRAM (TreD) Using Dual–Port DRAM Cell" by Sakurai, Nogami, Sawada and Iizuka, 1988 IEEE Custom Integrated Circuits Conference p. 4.3.1 through4.3.4.

* cited by examiner

*Primary Examiner*—Huan Hoang
(74) *Attorney, Agent, or Firm*—James J. Murphy, Esq.; Winstead Sechrest & Minick

(57) ABSTRACT

A memory 700 having an array 701 of rows and columns of dynamic memory cells 301, cells 301 of each row coupled to a refresh wordline 303*a* and an access wordline 303*b* and cells 301 of each column coupled to a refresh bitline 302*a* and an access bitline 302*b*. Refresh circuitry 711, 712, refreshes selected rows of cells corresponding to a refresh wordline 303*a* and a corresponding one refresh bitline 302*a*. Access circuitry accesses selected cells of a selected row using corresponding access wordline 303*b* and corresponding one of the access bitlines 302*b*. The access circuitry includes a new address detector of 709 for detecting receipt of a new address of said memory, a row decoder 702 for selecting access wordline in response to receipt of the new address and access sense amplifiers 703 and an access column decoder 704 accesses at least one cell along the selected wordline 303*b* using the corresponding access bitline 302*b*.

25 Claims, 9 Drawing Sheets

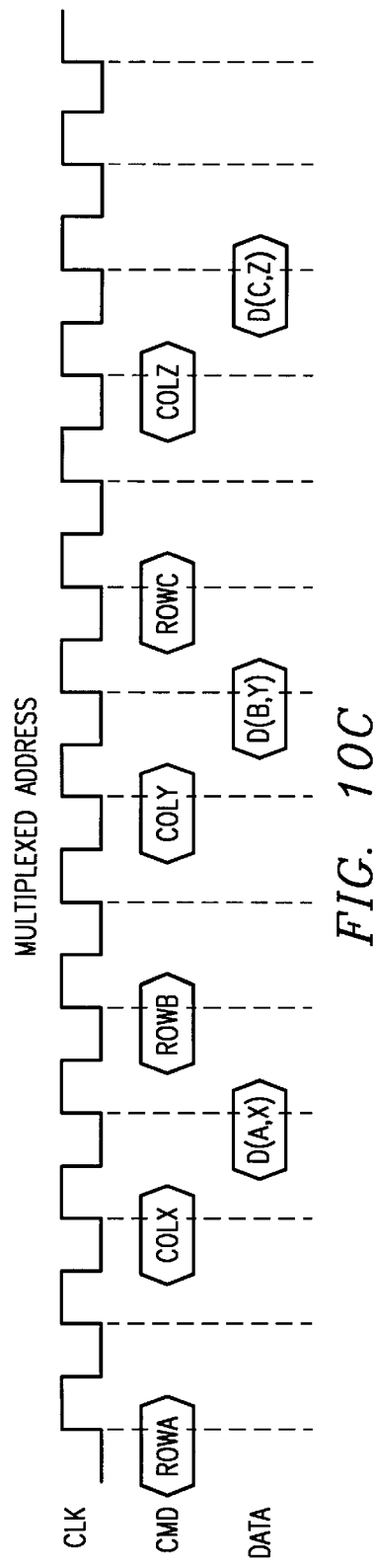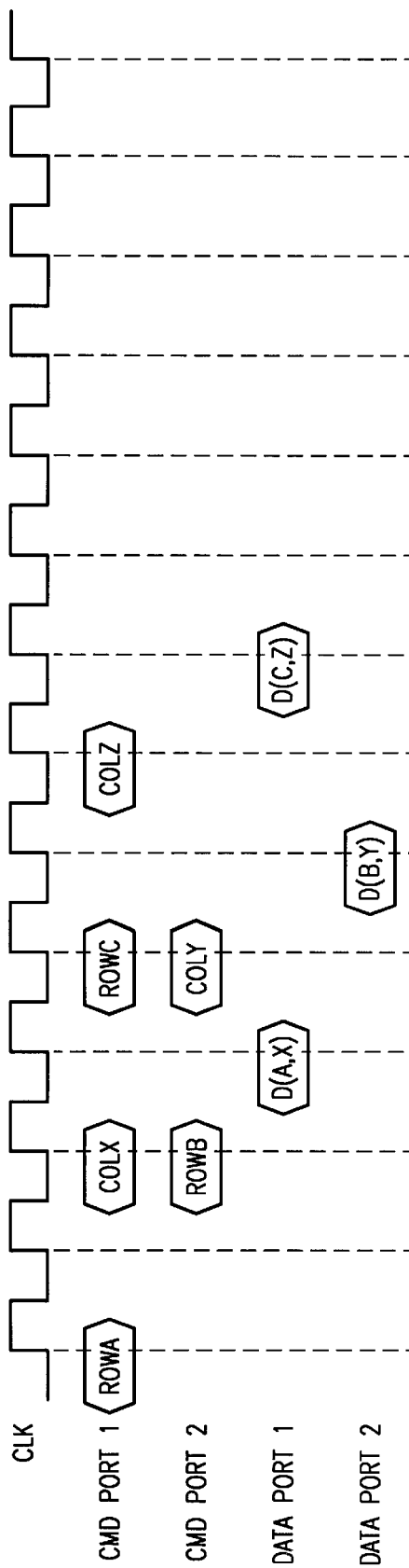

DYNAMIC RANDOM ACCESS MEMORY SYSTEM WITH A STATIC RANDOM ACCESS MEMORY INTERFACE AND METHODS FOR USING THE SAME

CROSS REFERENCE TO RELATED APPLICATIONS

This application for patent is a continuation-in-part of application U.S. Ser. No. 09/080,813 filed May 18, 1998, now U.S. Pat. No. 5,963,497, and entitled "A DYNAMIC RANDOM ACCESS MEMORY SYSTEM WITH SIMULTANEOUS ACCESS AND REFRESH OPERATIONS AND METHODS FOR USING THE SAME".

TECHNICAL FIELD OF THE INVENTION

The present invention relates in general to electronic memories and in particular to a dynamic random access memory with a Static Random Access Memory Interface operations and methods using the same.

BACKGROUND OF THE INVENTION

Dynamic random access memory (DRAM) is the principal type of memory used in most applications such as personal computers (PCS). When compared, for example, to static random access memory (SRAM), DRAM is less expensive, consumes substantially less power, and provides more bits in the same chip space (i.e. has a higher cell density). DRAM is normally used to construct those memory subsystems, such as system memories and display frame buffers, where power conservation and high cell density are more critical than speed. In most computing systems, it is these subsystems which dominate the system architecture, thus making DRAM the prevalent type of memory device on the market.

Notwithstanding these significant advantages, DRAMs are also subject to significant restraints due to the manner in which they must be constructed and operated. Specifically, since each cell stores data as charge on a capacitor (i.e. charged to a predetermined voltage for a logic 1 and discharged to approximately 0 volts for a logic 0), the length of time a bit, and in particular a logic 1 bit, can be stored in a given cell is a function of the ability of the capacitor to retain charge. Charge retention, and consequently data integrity is in turn a function of charge leakage.

For purposes of the present discussion, two particular charge leakage mechanisms will be considered. In the first mechanism, leakage from the capacitor storage plate to plate occurs because the high dielectric layers used to make small capacitors with sufficient capacitance are lossy. Second, charge on the storage plate of the cell leaks back through the pass transistor during the transistor off state ("subthreshold leakage"). In a robust DRAM design, each of these problems must be addressed.

Almost all DRAMs maintain data integrity through the periodic refresh of the memory cells to the voltage of the logic 1 data, which has deteriorated as charge has leaked off the capacitor, back to the full storage voltage. This is done by simply reading and restoring the data in cells in the cell array row by row. Depending on the refresh scheme, all the rows in the array or subarray may be refreshed by stepping though the rows in a single sequence or by distributing the refresh of smaller groups of rows of the array between read and write operations. In any event, refresh can seriously impact the performance of the DRAM. Among other things, refresh consumes memory cycles which would otherwise be available for reads and writes; every refresh of a row requires a new precharge/active cycle. With each cycle used for refresh, the array or subarray containing the row being precharged is unavailable for read and write accesses. The problem of refresh is only compounded as high density devices are contemplated, where the refresh period must be reduced in order to be able to refresh the entire array without reducing the time the system can access the memory.

Efforts have been made to minimize cell leakage such that the integrity of the data can be maintained for a longer period of time and hence the period between required refresh correspondingly increased. One way has been to bias the substrate in which the cells sit to reduce subthreshold leakage. Presently a triple-well process is used. Consider the case of n-channel pass transistors. In the triple-well process, the n-channel pass transistors in the DRAM cell (as well as the storage capacitors) array sit in an isolated p-type well which in turn sits in a n-type well. The n-type well has previously been formed in a p-type substrate. The p-type well in which the cells sit is then biased by a negative voltage $V_{BB}$, which is typically around −1 V, with respect to the grounded substrate. Similarly, Ip-channel pass transistors sit in an isolated n-type well which in turn sits in an s-type well. This effectively raises the threshold voltage of the cell pass transistors and cuts off subthreshold leakage. The separate p-well is used to isolate the array from the peripherals such that the biasing of the cell array does not degrade the performance of the peripheral circuits which have a grounded substrate. Without the isolated p-well, the substrate biasing would also raise the threshold of the transistors in the high performance peripherals and deteriorate their performance.

The triple well process along with the charge pumps which produce the bias voltage $V_{BB}$ are difficult and expensive to implement. The ability to eliminate them would provide substantial advantages over the prior art and represent a substantial leap in DRAM technology. Additionally, the elimination of the isolated p-well, and correspondingly the intervening n-well, the fabrication process for the cell array becomes more compatible with that of the remaining circuitry on the chip, particularly the high performance circuitry in the periphery.

As DRAM cell densities increase, cell size, and correspondingly storage capacitor size, must shrink. Capacitor size is a function of the capacitor dielectric material chosen, the higher the dielectric constant of the material, the more capacitance can be achieved per unit area. While high dielectric materials allow for the fabrication of smaller capacitors, such materials, due to their physical nature, are leaky and must be refreshed at a higher rate. On the other hand, lower dielectric materials are less leaky but force the use of larger capacitor plates. As a consequence, trench, stacked and other complex capacitor structures have been developed to allow the use of lower dielectric constant, lower leakage materials, and which consequently increase in capacitor plate size, while still allowing the overall size of the cells to be small.

Thus, the need has arisen for circuits, system and methods which support efficient refresh of DRAM arrays. Such methods circuits, systems and methods should be sufficiently robust such that the triple-well process and the associated charge pumps can be eliminated. Further, the ability to use leaky, high dielectric materials in the construction of smaller memory cells should also be addressed.

SUMMARY OF THE INVENTION

The principles of the present invention are embodied in a memory comprising an array of rows and columns of dynamic memory cells, the cells of each of the rows coupled to an access wordline and a refresh wordline and the cells of each column coupled to an access bitline and refresh bitline. Refresh circuitry refreshes a row of cells using a corresponding refresh wordline and a corresponding refresh bitline. Access circuitry accesses selected cells of a selected row using a corresponding access wordline and a corresponding access bitline. The access circuitry includes a new address detector for detecting receipt of a new address by the memory, a row decoder for selecting the access wordline in response to receipt of the row address, and access sense amplifiers and an access column decoder accessing at least one cell along the selected access wordline using the corresponding access bitline.

The present concepts are also embodied in an information storage device. A plurality of memory cells are organized in rows and columns, with each cell including a first transistor for coupling a storage capacitor of the cell with a first data line of a column of cells in response to a signal applied to a first control line to a row of cells containing the cell and a second transistor for coupling the capacitor with the second data line of the column of cells in response to a signal applied via a second control line to a row of cells containing the cell. The device also includes access circuitry and refresh circuitry. The access circuitry generates the receipt of an access address addressing a cell being accessed, decodes the address to activate the first control line of the row containing the cell being accessed, and exchanges data with that cell via the first data line of the column containing that cell. The refresh circuitry generates a refresh address addressing a cell being refreshed, compares the refresh address with the access address, and when the refresh address and the access address do not match, refreshes the cell being refreshed via the second control line of the row containing the cell.

A further embodiment of the present teachings is a memory system which includes a plurality of blocks of data storage circuitry. Each block includes a subarray of 2-transistor, 1-capacitor memory cells disposed in rows and columns, first transistor of each cell selectively coupling a cell storage capacitor with a first bitline of a corresponding column in response to activation of a first subwordline of a corresponding row and a second transistor of each cell selectively coupling the cell storage capacitor with a second bitline of the corresponding column in response to activation of a second subwordline of the corresponding row. Each block also includes an access subwordline driver for selecting the first subwordlines in the array, access sense amplifiers for accessing cells via the first bitlines of the subarray, a refresh subwordline driver for accessing the second subwordlines of the array and refresh sense amplifiers for refreshing cells via the second bitlines of the subarray. The memory system also includes access row decoder circuitry for selecting an access subwordline driver in response to an access address, refresh row decoder circuitry for selecting a refresh subwordline driver in response to a refresh address and a refresh address generator for generating the refresh address.

Methods are also disclosed for operating a memory including a plurality of memory cells, each cell including a first transistor for coupling a storage capacitor of the cell with a first dataline of a column of cells containing the cell in response to a signal applied via a first control line of a row of cells containing the cell and a second transistor for coupling the storage transistor with a second data line of the column of cells in response to a signal provided by a second control line of the row of cells. A cell is accessed upon detecting the receipt of an access address addressing a cell being accessed, decoding the address to activate the first control line of a row containing the cell being accessed, and exchanging data with the cell being accessed via the first dataline from a column containing the cell being accessed.

Substantially simultaneously with the accessing of a cell, another cell is refreshed. A refresh address is generated for at least one cell being refreshed. The refresh address is compared with the access address and when the refresh address and the access address do not match, the cell being refreshed is refreshed via the second control line containing the row of the cell being refreshed and the second bitline of the column of cells containing the cell being refreshed.

The present invention allows for cells to be refreshed at a higher rate than in conventional DRAM cells, such that leaky high dielectric materials can be used in the construction of memory cells. With the use of high dielectric materials, memory cell size shrinks. Further, since higher cell leakage can be tolerated, the conventional triple-well process and the associated charge pumps can be eliminated. Finally, the principles of the present invention apply to the construction and operation of a dynamic memory which emulates an SRAM.

BRIEF DESCRIPTION OF THE DRAWINGS

For a more complete understanding of the present invention, and the advantages thereof, reference is now made to the following descriptions taken in conjunction with the accompanying drawings, in which:

FIG. 10C is a timing diagram depicting the operation of a synchronous dynamic random access memory with a multiplexed address port; and FIG. 10D is a timing diagram depicting the operation of a synchronous dynamic random access memory with a multiplexed address port embodying the principles of the present invention.

DETAILED DESCRIPTION OF THE INVENTION

The principles of the present invention and their advantages are best understood by referring to the illustrated embodiment depicted in FIGS. 1–5 of the drawings, in which like numbers designate like parts.

Figure 1A:
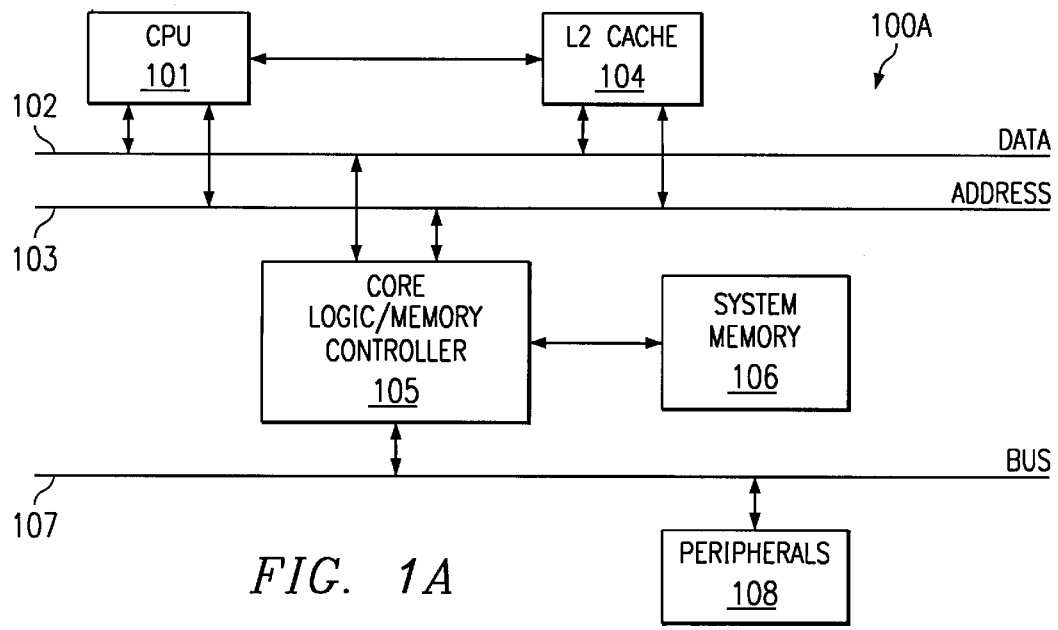
FIGS. 1A and 1B are block diagrams respectively depicting two basic system architectures typical of those found in personal computers.
Figure 1B:
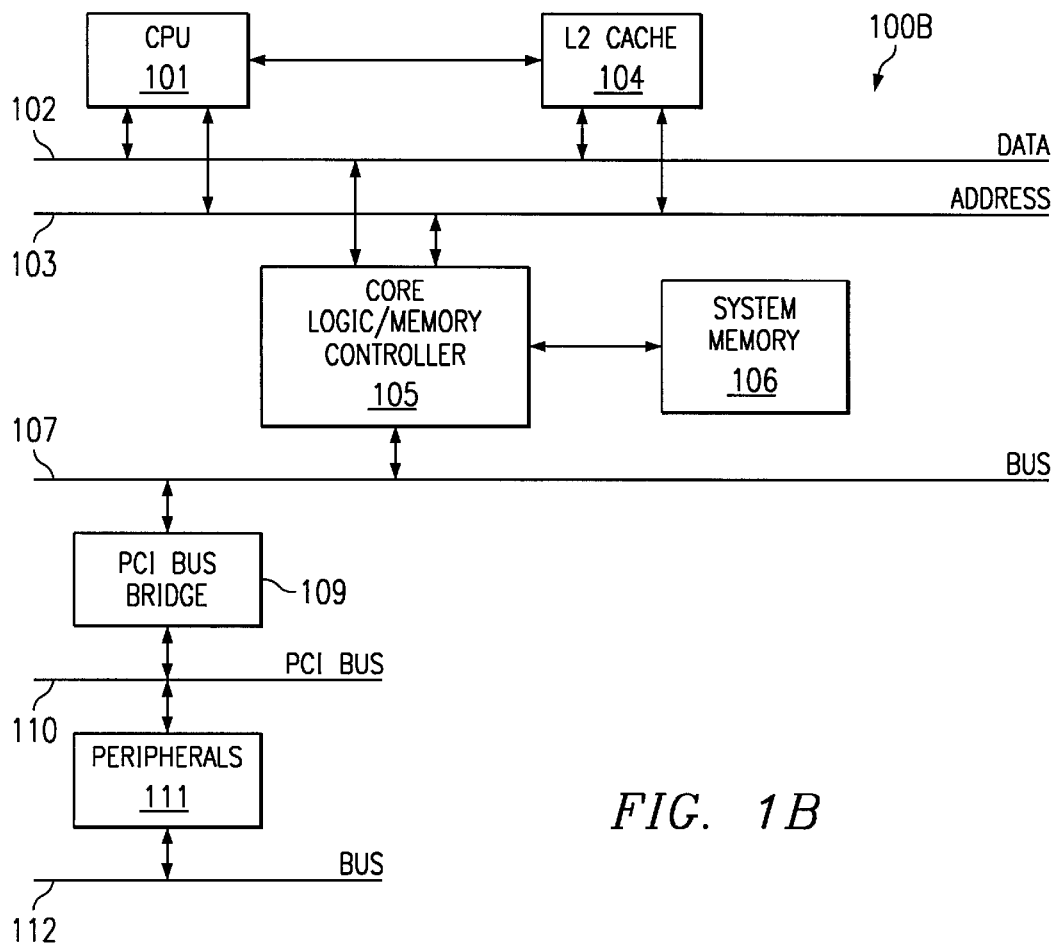

FIGS. 1A and 1B are block diagrams respectively depicting two basic system architectures 100A and 100B typical of those found in personal computers (PCS). While numerous variations on these basic architectures exist, FIGS. 1A and 1B are suitable for describing the basic structure and operation of most PCS. Both systems 100A and 100B include a single central processing unit 101, CPU local data bus 102, CPU local address bus 103, external (L2) cache 104, core logic/memory controller 105, and system memory 106. In system 100A, the peripherals 108 are coupled directly to core logic/memory controller 105 via a bus 107. Bus 107 in this case is preferably a peripheral controller interface (PCI) bus, although alternatively it could be an ISA, general, or special purpose bus, as known in the art. In system 100B, core logic/memory controller 105 is again coupled to bus 107. A PCI bus bridge then interfaces bus 107 with a PCI bus 110, to which the peripherals 111 couple. An additional bus 112, which may be an ISA, PCI, VESA, IDE, general, or special purpose bus, is provided for access to peripherals 111 from an external device or system (not shown).

In single CPU systems 100A and 100B, CPU 101 is the "master" which, in combination with the operating system and applications software, controls the overall operation of system 100. Among other things, CPU 101 performs various data processing functions including numerical and word processing, generates graphics data, and performs overall system management. CPU 101 may be for example a complex instruction set computer (CISC), such as an Intel Pentium™ class microprocessor, a reduced instruction set computer (RISC), such as an Apple PowerPC™ microprocessor, or a very long instruction word (VLIW) machine.

CPU 101 communicates with the remainder of system 100 via CPU local data and address buses 102 and 103, each of which may be for example a special bus, or a general bus, as known in the art.

Core logic/memory controller 105, under the direction of CPU 101, controls the exchange of data, addresses, control signals and instructions between CPU 101, system memory 105, and peripherals 108/111 via bus 107 and/or PCI bus bridge 109. Although the core logic/memory controller allows tasks to be shifted from the CPU, thereby allowing the CPU to attend to other CPU-intensive tasks, the CPU can always override core logic/memory controller 105 to initiate execution of a higher priority task.

Core logic and memory controllers are widely available in the PC industry and their selection and application are well known by those skilled in the art. The memory controller can be either a separate device or incorporated into the same chip set as the core logic. The memory controller is generally responsible for generating the memory clocks and control signals such as SCLK (System Clock) /RAS, /CAS, R/W and bank select, and monitors and controls cell refresh. The memory controller may also have some address generation capability for accessing sequences of pages.

The core logic is typically comprised of a chip-set, with one or more chips typically being "address and system controller intensive" and one or more chips typically being "data intensive." Among other things, the address intensive chip(s): interfaces CPU 101 with address bus 103; maintains cache coherency, including the cache tags, set associative cache tags and other data necessary to insure cache coherency; performs cache "bus snooping"; generates the control signals required for DRAMs in the system memory or cache; and controls general management transactions. The data intensive chip(s) generally: interfaces CPU 101 with the data bus 102; issues cycle completion responses; may abort operations if their cycles are incomplete; and arbitrates for the data path of bus 102.

CPU 101 can directly communicate with core logic/memory controller 103 or through an external (L2) cache 104. L2 cache 104 may be for example a 256 KByte fast SRAM device(s). Typically, the CPU also maintains up to 16 kilobytes of on-chip (L1) cache.

PCI bus bridges, such as PCI bus bridge 109, are also well known to those skilled in the art. In the typical PC, the CPU is the bus master for the entire system and hence devices such as PCI bus bridge are slave devices which operate under command of the CPU.

Peripherals 108/111 may include a display controller and associated frame buffer, floppy drive controller, disk driver controller, and/or modem, to name only a few options.

Figure 2:
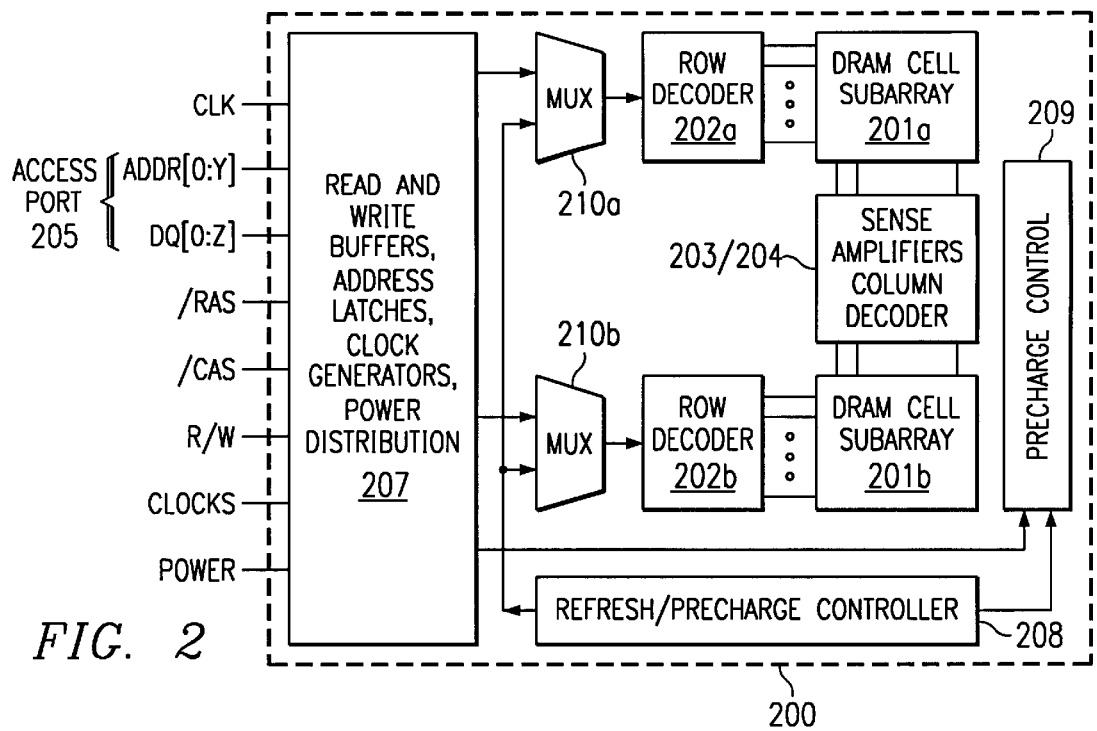
FIG. 2 illustrates a high level functional block diagram of a memory embodying the principles of the present invention.

FIG. 2 is a high level functional block diagram of a DRAM memory 200 embodying the teachings of the present invention. Memory 200 is suitable for such applications as system memory 106 in either of the exemplary processing environments shown in FIGS. 1A and 1B. Many other applications of memory 200 are possible.

Memory 200 includes an array 201 organized as a pair of subarrays 201a and 201b (collectively array 201), each composed of rows and columns of DRAM cells. Each row of cells is associated with at least two conductive wordlines and each column of cells is associated with at least two conductive bitlines. This unique double bitline/double wordline approach will be discussed in detail below.

Generally, during an access, a row of cells in array 201 is selected in response to a received row address by one of the row decoders 202a or 202b. The given decoder activates one of the pair of conductive wordlines associated with that row. Data is input to or output from, each selected cell along the row through one of the pair of bitlines associated with the corresponding column and the column decoder 204 in response to a received column address.

During a read, the data from the entire active row of cells are sensed and latched by sense amplifiers 203. For discussion purposes, it will be assumed that the bitlines are coupled to sense amplifiers 203 and read buffers (block 207). During a write, data are transferred to the locations addressed by the column address along the active row by the write buffers (block 207) directly through sense amps 203 (the data in sense amplifiers 203 are essentially written over).

In the illustrated embodiment, the data passed by sense amps 203 are selectively input to or output from device 200 through Z+1 number of access data input/output lines (DQ [0:Z]) in response to row and column addresses received at Y+1 number of corresponding multiplexed access address lines (ADD[0:Y]). Collectively, the access data lines and the access address lines comprise access port 205.

Row addresses are latched into address latches within block 207 through the multiplexed address lines on the falling edge of external /RAS. At least one column address is similarly latched through the access address lines on the falling edge of external /CAS. (For page and burst mode accesses, column addresses can be generated externally and input with external /CAS or can be generated internally). External /RAS is also used to time the precharging of only one of the two bitlines associated with each column of cells (as discussed below, the other bitline in each column is used for refresh and has a precharge timing based on an internal /RAS signal or clock).

Block 207 generally includes the traditional input/output circuitry, including read and write buffers, address latches, power distribution circuitry and clock generation circuitry. If DRAM 200 is a synchronous DRAM, it will include the synchronous DRAM master clock (CLK) which controls the overall timing.

DRAM 200 further includes internally a refresh/precharge controller 208, precharge circuitry 209 and multiplexers 210. Collectively, this circuitry allows for the data in selected rows of cells in the array to be refreshed simultaneously with data accesses to other selected rows in the array. Since entire rows are read and restored during refresh (i.e. there is no paging or bursting during refresh) the internal refresh /RAS active period controlling precharge circuitry 208/209 during refresh operations can be relatively short. In other words, the internal /RAS controlling precharge of the refresh bitlines can run not only asynchronously with respect to the external /RAS, but also at a much higher frequency.

Figure 3:
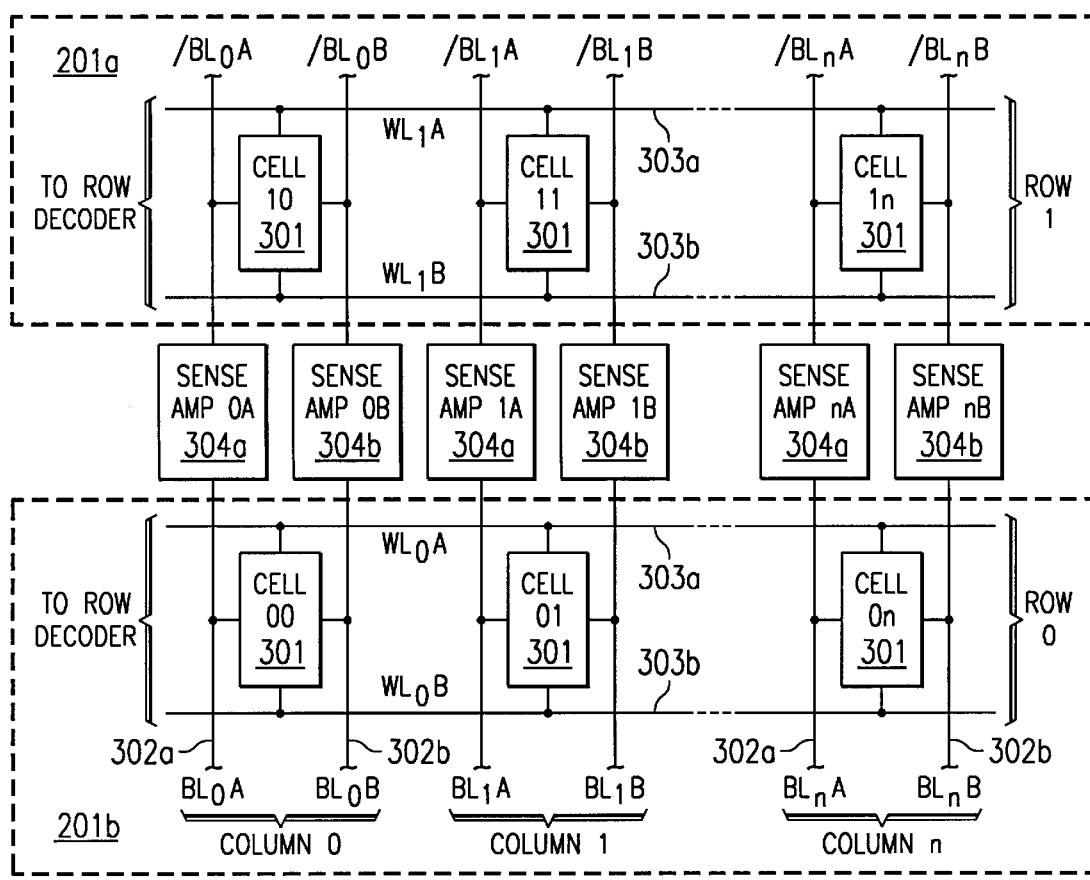
FIG. 3 is a diagram of a highly enlarged small portion of the memory array shown in FIG. 2.

FIG. 3 depicts a portion of subarrays 201a and 201b and the corresponding sense amplifiers 203. Specifically, FIG. 3 shows three exemplary physical columns (Columns 0, 1 and n) and two exemplary rows (Rows 0 and 1) of an m row by n column array, with respective halves of the rows disposed in one of the subarrays 201a or 201b. In actual implementation the number of rows and columns will be much larger, the array could be, for example, 1024 rows by 1024 columns (i.e. m=n=1024) or larger.

In the illustrated embodiment of FIG. 3, an open bitline arrangement is employed, although a folded bitline approach could also be selected. Each cell 301 in each subarray 201 is coupled to a pair of bitlines 302a and 302b (labeled $BL_iA$ and $BL_iB$, where i is the column number between 0 and n) and a pair of wordlines 303a and 303b (labeled $WL_jA$ and $WL_jB$, where j is the row number between 0 and m). Each bitline 302a/302b of each column is coupled to a corresponding dedicated sense amplifier 304a or 304b, with the corresponding bitlines of subarrays 201a and 201b coupled to the same sense amplifier 304 being complementary. For illustration, the even numbered pairs of wordlines 303 (i.e. 0, 2, 4 . . .) are in subarray 201b and the odd numbered pairs (i.e., 1, 3, 5 . . . ) in subarray 201a.

Figure 4:
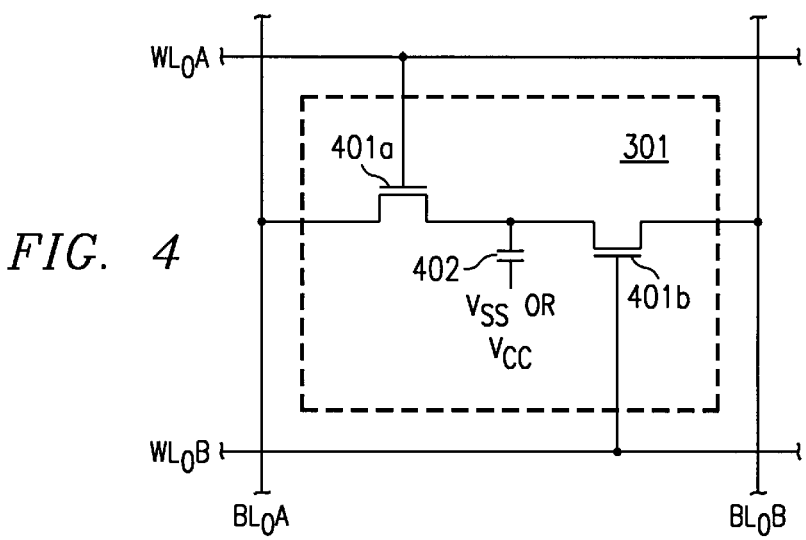
FIG. 4 is a diagram of a highly enlarged memory cell of FIG. 3.

Cells 301 are preferably constructed as the 2-transistor, 1-capacitor (2T-1C) cell depicted in FIG. 4. For discussion purposes, the cell at the intersection of wordlines $WL_0A$ and $WL_0B$ and bitlines $BL_0A$ and $BL_0B$ is shown for reference. Each cell includes a first pass transistor 401a for coupling a first plate of data storage capacitor 402 with bitline $BL_0A$ in response to an active (high) voltage impressed on $WL_0A$. A second pass transistor 401b similarly selectively couples the storage capacitor 402 to bitline $BL_0B$ when an active (high) voltage is presented on wordline $WL_0B$. For a complete description of cells 301 and their advantages, reference is now made to copending and coassigned patent applications U.S. Ser. No. 09/016,559 entitled "LOW LATENCY MEMORIES AND SYSTEMS USING THE SAME", filed Jan. 30, 1998, and Ser. No. 08/911,737, filed Aug. 15, 1997 and entitled "LOW LATENCY DRAM CELL AND METHOD THEREFOR" both incorporated herein by reference.

According to the principles of the present invention, selected rows in array 201 can be accessed while other selected rows are simultaneously refreshed. Generally, simultaneous access and refresh operations can be accomplished by using one bitline of each column and one wordline of each row for data accesses through access port 205 and the other bitline of each column and the other wordline of each row for refresh under control of internal refresh/precharge controller 208. Although other configurations are possible, for ease of discussion, assume that addresses internally generated for refresh by refresh controller 208 are decoded to exclusively access wordlines $WL_jA$, with refresh effectuated by bitlines $BL_iA$ and the corresponding sense amplifiers 304a. Consequently, addresses received at access port 205 are decoded to exclusively access wordlines and bitlines $WL_jB$ and $BL_iB$ through sense amplifiers 304b.

Figure 5:
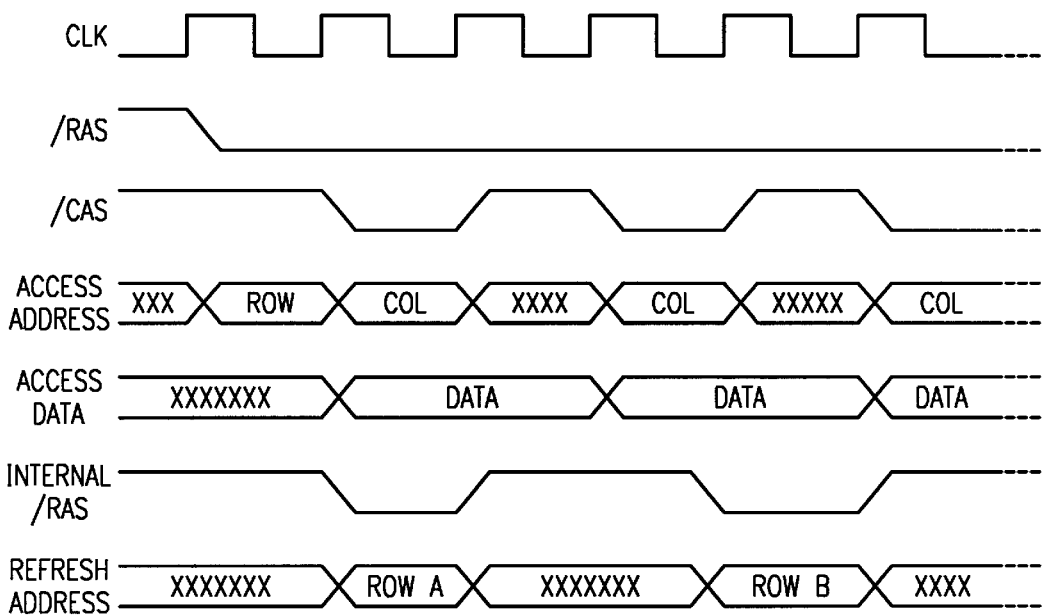
FIG. 5 is a timing diagram illustrating a typical operation of the memory of FIG. 2.

The operation of memory 200 can now be described with reference to FIG. 5 which is a simplified conceptual timing diagram. It should be noted that while a traditional operating scheme using /RAS and /CAS is shown, these strobes are not required in every embodiment of the present teachings. For example, in synchronous embodiments, all timing can be based solely on the system clock (CLK.)

On the falling edge of the external /RAS, a row address is latched in to select the wordline $WL_jB$ associated with the row to which the desired data access is being performed. The selected row can be any row in array 201; however, for discussion purposes assume that the Row 1 has been selected for access. Shortly after the external /RAS transitions low, the voltage on wordline $WL_jB$ transitions high, the pass transistor 401b of each cell 301 of Row 1 turns-on and the capacitors 402 of that row are available for access through bitlines $BL_iB$.

For a read, the data from the entire selected row of cells 301 are sensed and latched by sense amplifiers 304b. In the case where Row 1 has been selected, bitlines $BL_iB$ of subarray 201a carry data to sense amplifiers 304b and bitlines $BL_iB$ of subarray 201b are used as the complementary bitlines for sensing purposes. During a write, the data in sense amplifiers 304b are overwritten as new data is driven from the write buffers within block 207.

On each falling edge of external /CAS, a column address is latched-in through the address lines of access port 205 and words of data are transferred to or from the sense amplifiers 304b of the addressed columns via the data lines of access port 205 (/CAS can also be generated internally on-chip). The width of each word of data is a design choice; for example, in a "by 16" device 16 bits are accessed per column address (/CAS cycle). The number of words paged in or out with each new column address during the time when /RAS is low can vary from one up to the maximum number of words per row, depending on the application.

In this example, refresh is performed by refresh/precharge controller 208 independent of any data accesses made through access port 205. As shown in FIG. 5, an internal /RAS signal or similar clock controls the refresh timing asynchronous to the externally generated signals controlling the data accesses (e.g. external /RAS and /CAS). For discussion purposes, it will be assumed that the refresh operations are being timed by an internal /RAS signal, although these operations can also be timed off an internal clock generated by the system clock.

During each period in which the internal /RAS is high, refresh/precharge controller 208 and precharge circuitry 209 precharge bitlines $BL_iA$ of array 201. Then, on the falling edge of internal /RAS, the active refresh period begins.

Refresh/ precharge controller 208 generates a refresh row address to any row in array 201. Specifically, this refresh row address selects the wordline $WL_jA$ of the row to be refreshed; assume for example wordline $WL_0A$ of Row 0. The row address is decoded, wordline $WL_0A$ is activated and pass transistors 401a of each of the cells along Row 0 turn-on. The data stored in Row 0 are then read and restored by sense amplifiers 304a through bitlines $BL_iA$. On the rising edge of /RAS, bitlines $BL_iA$ are then returned to precharge. These row refresh cycles can be continuously performed essentially independently from the data access being performed through the access port and the external /RAS timing.

Controller 208 can refresh bitlines using any one of a number of schemes. For example, it can simply sequentially generate row addresses using a counter and refresh the rows in the entire array 201 in sequence beginning from Row 0. Alternatively, refresh can be done on a subarray by subarray basis, a distributed block by block basis, or even a distributed row by row basis.

The primary advantage of the present teachings is that since one or more rows can be refreshed while another row is accessed, embodying devices can operate significantly faster. In particular, the refresh rate can be significantly increased over conventional DRAM devices. Increased refresh rate in turn allows for a higher tolerable leakage rate for the capacitors in the cells in the DRAM cell array. Thus, the higher dielectric constant materials necessary to make smaller planar storage capacitors 402 can be used, and hence smaller cells 301, can be fabricated without the need for stacked or trench capacitor technologies. Further, since higher cell leakage is tolerable, the triple-well process and the accompanying charge pumps can be eliminated.

An exemplary cell according to the present teachings may for example have the following leakage characteristics, defined in terms of tREF, which is the refresh time between $tREF_{max}$ and $tREF_{min}$:

$tREF_{max}$=3.8 microseconds×number of rows in array 201; and $tREF_{min}$=tRESTORE×number of rows in array 201.

where:

3.8 microseconds is the maximum period for refreshing a row (i.e. refresh overhead);

$tREF_{max}$ is the maximum time between refresh cycles for a given row of cells;

$tREF_{min}$ is the minimum time between refresh cycles for a given row of cells; and tRESTORE is the time from a row address change until the sense/restore function of the addressed row is complete in the minimum amount of time achievable in the fabrication and design technology applied.

These specifications are in sharp contrast to the prior art where the maximum refresh rate of the system is 3.8 microseconds×the number of rows in the memory. In other words, using conventional DRAMs, a system takes a time-out to refresh a row of cells only after at least 3.0 microseconds of data accesses. With the present invention, the refresh overhead can be reduced to zero and 100 percent of the time accesses can be made to the array.

Figure 6:
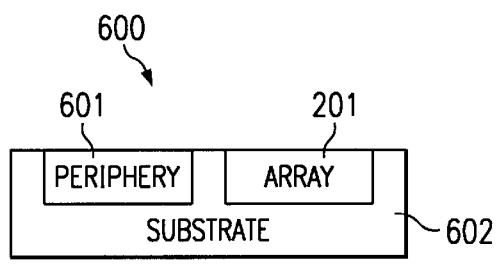
FIG. 6 is an elevational drawing of a semiconductor device embodying the principles of the present invention.

FIG. 6 is a highly enlarged portion of a semiconductor chip 600 embodying the circuitry of the present invention. Specifically, both array 201 and peripheral circuitry 601 can now be formed in the same substrate 602 (without the need for the isolated p-well for array 201). For example, all n-channel transistors in periperhy 601 and array 201 are now formed in a p-substrate 602.

In addition to the cost savings associated with manufacturing DRAMs on a grounded substrate (i.e., without the triple-well process), another key advantage is increased performance of the memory device. As integrated circuit technology scales to smaller feature sizes, it is necessary to reduce the operating voltage of the transistors. In the conventional DRAM technology the substrate which is normally biased at a negative voltage with respect to ground inhibits the ability to scale the operating voltage of the sense amplifier, as well as other core circuits, without sacrificing signal noise margins and sensing speed performance. This is due to the higher effective threshold voltages caused by the substrate bias. With a grounded substrate, some processes (e.g. ASIC logic) have even allowed the operating voltages to drop below one volt. Even in non-portable applications, this lower voltage results in large power savings for the overall system. A DRAM fabricated on this process can take advantage of these benefits without sacrificing speed and reliability.

Figures 7A, 7B:
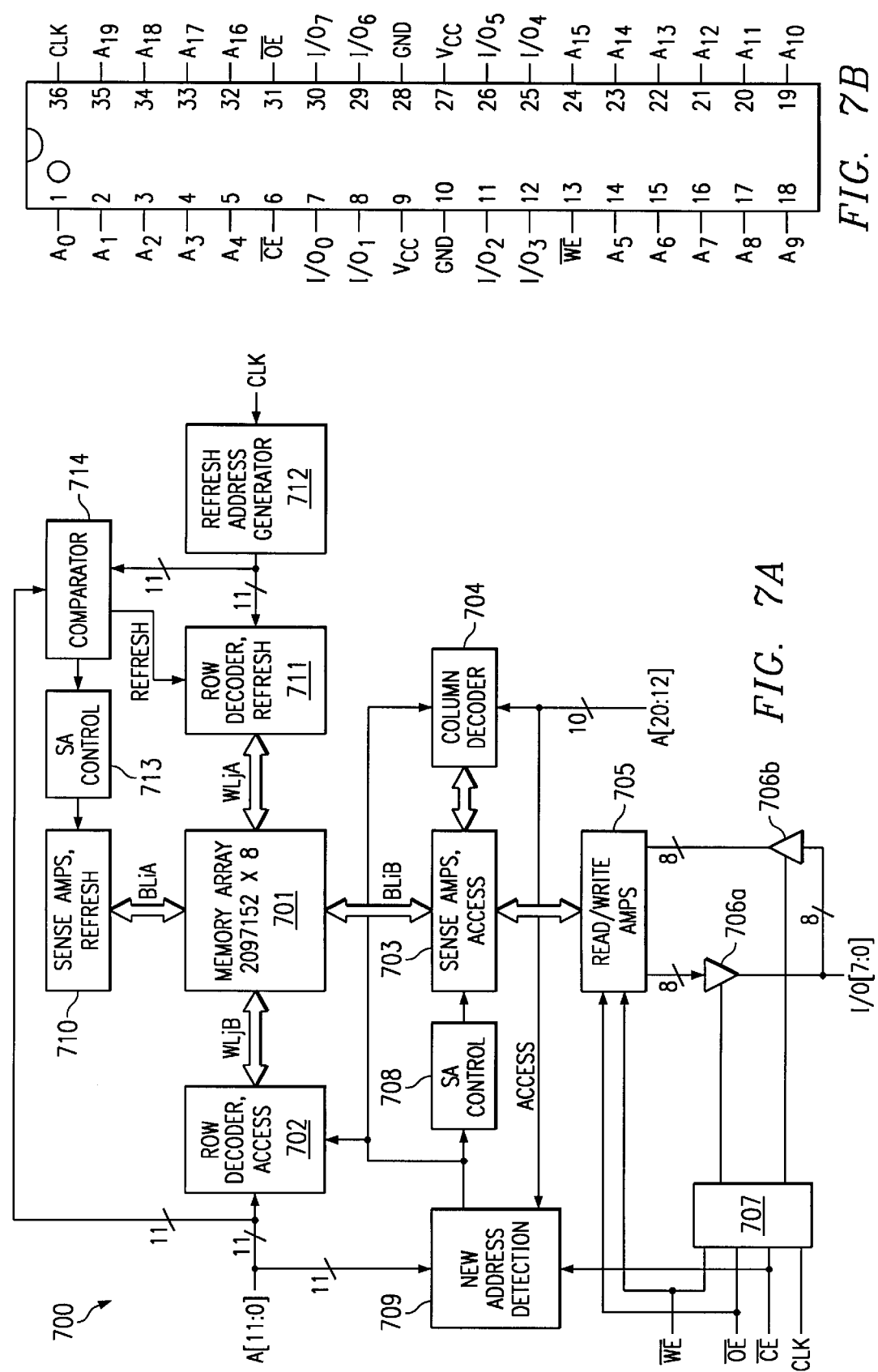
FIGS. 7A and 7B are a functional block diagram and a package pinout for a second memory embodying the principles of the present invention.

FIG. 7A is a functional block diagram of a second memory 700 embodying the principles of the present invention. Memory 700 is a dynamic memory which does not require /RAS and /CAS and consequently emulates a static random access memory (SRAM). Advantageously, such an embodiment does not require refresh control demands be imposed on the system, as well as no requirement for RAS, CAS, or a multiplexed addressing scheme. When used as a memory module for embedded applications, memory 700 emulates an SRAM memory module to the ASIC designer. Memory 700 eliminates bus contention problems during refresh, as seen in conventional DRAM designs. Further, the need for a conventional DRAM memory controller within the core logic is eliminated.

In the illustrated embodiment, memory 700 is based on a 2 megabyte (2097152×8 bit) array 701 of memory cells 301, although the size of array will vary depending on the application and/or the process used in its fabrication. For purposes of discussion, assume that array 701 is partitioned into 256 subarrays organized as a 16×16 matrix, with the memory cells in each subarray arranged in 256 rows and 256 columns. A preferred subarray structure will be discussed in conjunction with FIGS. 9A and 9B.

Memory 700 essentially consists of two sets of addressing and control circuitry. The first set is used to enable data accesses to locations in array 701 and generally includes: an access row decoder 702, access sense amplifiers 703, access column decoder 704, access read-write amplifiers 705, buffers 706a and 706b, control gates 707a and 707b, access sense amplifier controls 708, and new address detection circuitry 709. The second set of addressing and control circuitry is dedicated to array refresh and includes refresh sense amplifiers 710, refresh row decoder 711, refresh row address generator 712, sense amplifier control circuitry 713 and comparator 714. Memory 700 also includes an on-chip clock generator 715. Each of these blocks and the interactions there between can now be discussed in detail.

Access row decoder 702, in the illustrated 2 Mbyte embodiment, receives 12 row address bits A[11:0] and in response selects a wordline $WL_jB$ in array 701. For discussion purposes, assume that the 12 row address bits are received by memory 700 simultaneously with the receipt of 9 column address bits A[20:12] in a single 21 bit address word A[20:0]from a non-multiplexed address bus. Access row decoder 702 is enabled each time a new set of address bits are detected by new address detection circuitry 709. In alternate embodiments, the row and column address bits may be received word-serial from a multiplexed address bus, timed by an external clock or control signal.

While the Access sense amplifiers are shown generally at 703, preferably they are distributed across array 701, for example on a subarray by subarray basis (Distributed sense amplifiers will be discussed further in conjunction with FIGS. 9a and 9b). Generally, each bitline $BL_iB$ and its complement $/BL_iB$ are coupled to a sense amplifier 304 in an open bitline fashion as shown in FIG. 3 although a folded bitline could also be used. Access sense amplifiers 703 are dedicated to precharging and equalizing bitlines $BL_iB$ of a corresponding subarray during each bitline precharge cycle and to latching data for presentation to the read and write amplifiers 705 during each bitlines access cycle, as discussed above. Control of access sense amplifiers 703 is effectuated by access sense amplifier control unit 708 and column decoder 704.

Access column decoder 704 receives the nine column address bits (A[20:12]) of each address word A[20:0] and decodes these bits into a set of signals driving a set of Y-lines. These Y-lines in turn are connected to data transfer transistors in access sense amplifiers 703 which gate data exchanges between locations (a cell or group of cells) in the corresponding subarray and the read-write amplifiers 705. Reads and writes through read-write amplifiers 705 and I/O buffers 706 are controlled by the externally generated output enable (/OE), chip enable (/CE) and write enable (/WE) signals.

Access sense amplifier control circuitry 708 enables and times such sense amplifier functions as bitline equalization, bitline isolation, and sense and restore, under the control of new address detection circuitry 709. In particular, this circuitry allows the access bitlines $BL_iB$ to be precharged and accessed independently from the refresh precharge and sense and restore operations. As already briefly indicated, new address detection circuitry 709 detects when a change in the row address bits has occurred. When a change in row address occurs, and memory 700 is currently in an access cycle (e.g., words are being paged to or from the current row through a sequence of column addresses), that cycle is allowed to complete and then a new access cycle to a new row is initiated. The output of new address detection circuitry 709 is used to enable the functioning of access row address decoders 702, column decoder 704, and access sense amplifier control circuitry 708.

Refresh sense amplifiers 710 are coupled to bitlines $BL_iA$ and are dedicated to sensing and restoring the data in a row of cells along wordline (subwordline) $WL_jA$ in the corresponding subarray, in response to refresh addresses decoded by refresh row decoder 711. As with the access sense amplifiers, refresh sense amplifiers 710 are preferably distributed across array 701.

Refresh row addresses are internally generated by row address generator 712 and provided to refresh decoder 711 for refresh row selection. Refresh address generator 712 in this example is a 12-bit counter which runs continuously from a minimum value to a maximum value, and then rolls-over to the minimum value again although other counting patterns are possible.

Comparator 714 compares each refresh address output from address generator 712 with the current access row address. If the two are different, then the address from refresh generator 712 is used to refresh the addressed row in the corresponding subarray. When the refresh address and the access address match, refresh of the addressed row is foregone in favor of the access to that row. Assuming the maximum allowable time between refreshes for the foregone row of cells will not be exceeded, the cells of that row can be refreshed when the address generator reaches the corresponding address again. Alternatively, a timeout can be taken from the refresh sequence until the access is completed.

Control of refresh sense amplifiers 710 is effectuated by refresh sense amplifier control circuitry 713. Among other thing, control circuitry 713 times the bitline equalization, bitline isolation and sense and restore operations for refresh bitlines $BL_iA$.

FIG. 7B is an exemplary package/ pinout diagram supporting the 2 Mbyte embodiment of memory 700 described above. The packaging/pinout for memory 700 will vary from application to application, depending on such factors as the size of the array, the width of the address port and the width of the I/O port.

Figure 8:
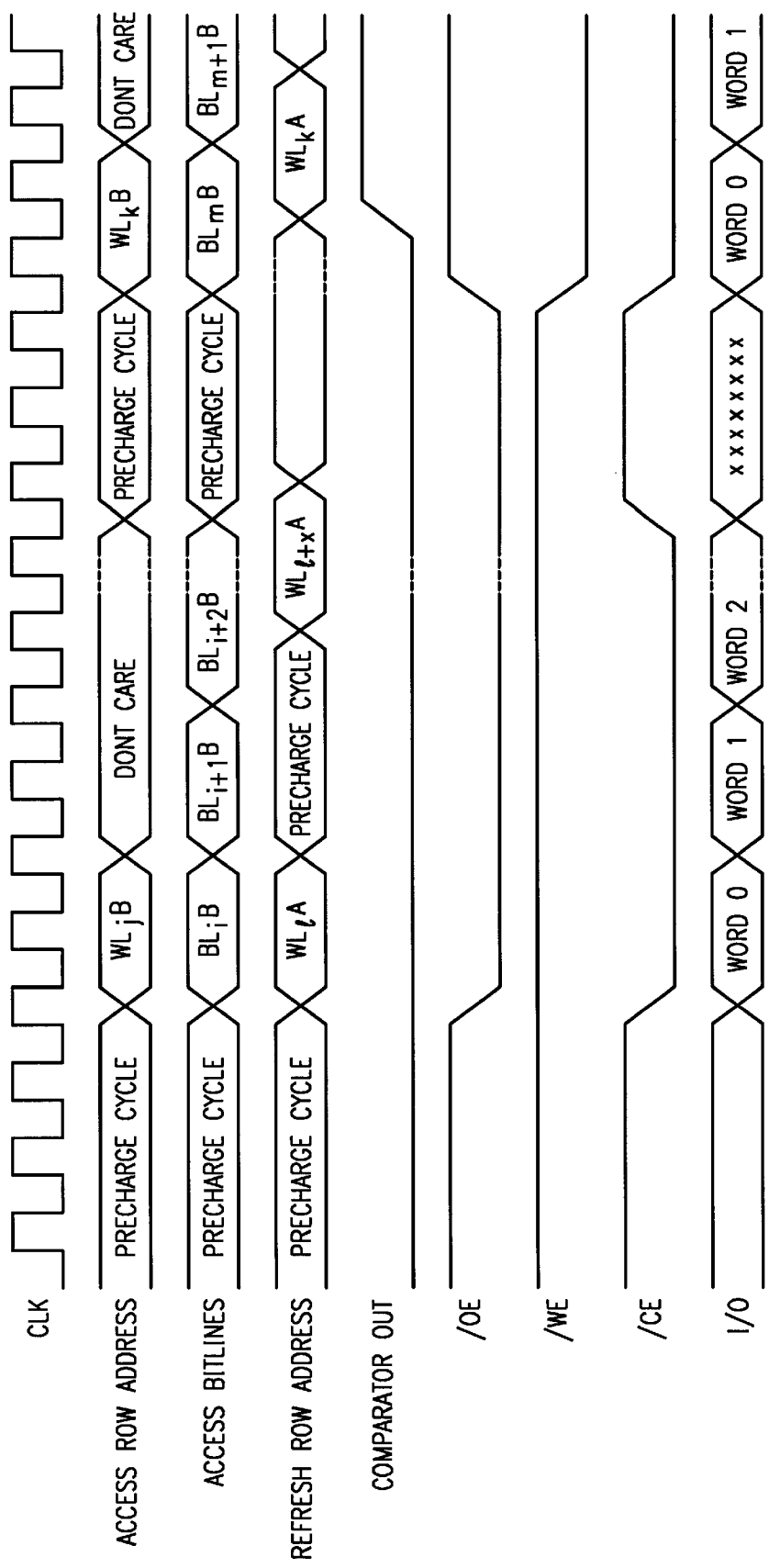
FIG. 8 is a timing diagram illustrating a typical operation of the memory of FIG. 7.

The typical operation of memory 700 can be described with reference to the timing diagram of FIG. 8. In this description memory 700 is operating synchronously in response to a system clock signal CLK. Clock signal CLK could be generated for example by the core logic/memory controller or by the CPU itself. As initial conditions, it will be assumed that both the refresh and access bitlines and sense amplifiers are in precharge.

An access cycle begins with the receipt of an address word selecting a given location along a given access wordline $WL_jB$ and a set of access bitlines $BL_iB$. The first row access is depicted as a read operation, therefore the output enable signal /OE transitions to an active low state and the write enable signal /WE to an inactive high state. After a short delay, Word 0 is read from the addressed location through amplifiers 705 and buffers 706a. In a page mode, as shown in FIG. 8, additional column addresses, generated internally or externally, are used to sequentially read a predetermined number of additional locations along wordline $WL_jB$ using additional access bitline $BL_iB$ (e.g., $BL_{i+1}B$, $BL_{i+2}B$, . . . ).

While data are being read through the I/O port (I/O [7:0]), refresh address generator 712 is generating a sequence of refresh addresses, refresh sense amplifier control circuitry 713 is initiating precharge, and active refresh cycles and rows of cells are being refreshed using refresh wordlines $WL_{j+x}A$ and refresh wordlines $BL_jA$. As long as wordline $WL_jA$ is not selected simultaneously with $WL_jB$, for a given value of j, the output of comparator 714 is in an active low state and sequence of row refreshes continues uninterrupted. As described above, the row refresh operations can advantageously be performed at a rate higher than the access operations and thus smaller and/or leakier capacitors can be used in the fabrication of array 701.

In the second access row address cycle, access wordline $WL_kB$ is selected by the access address and data paging begins with the initial column address selecting bitlines $BL_mB$. In the second cycle, a write is assumed and therefore the write enable signal /WE transitions to an active low state and the output enable signal /OE transitions to an inactive high state. Data (e.g., word 0, word 1, . . . ) are written through the I/O port (I/O [7:0]) in response to /CE.

As noted above, the refresh of array 701 has been continuing using wordlines $WL_jA$ and bitlines $BL_iA$. However, at some point as depicted in FIG. 8, the refresh address and the access address both address the same row of cells in array 701, albeit through different wordlines and bitlines (in the illustrate example, the refresh address selects wordline $WL_kA$ and the access address selects wordline $WL_kB$). Whenever this situation occurs, the output of the comparator (COMPARATOR OUT) transitions to an inactive high state and the refresh of the addressed row via wordline $WL_kA$ is foregone or postponed in lieu of the data access along wordline (row) $WL_kB$. As soon as the refresh and access row addresses are directed to different rows, for example when row address generator 712 increments the refresh row address or when the access address changes, the comparator output transitions to active low again and the refresh resumes with either the new addressed refreshed row (if the current row was skipped) or the currently addressed refresh row (in the case where the refresh was simply delayed pending completion of the access to that row.)

Figure 9A:
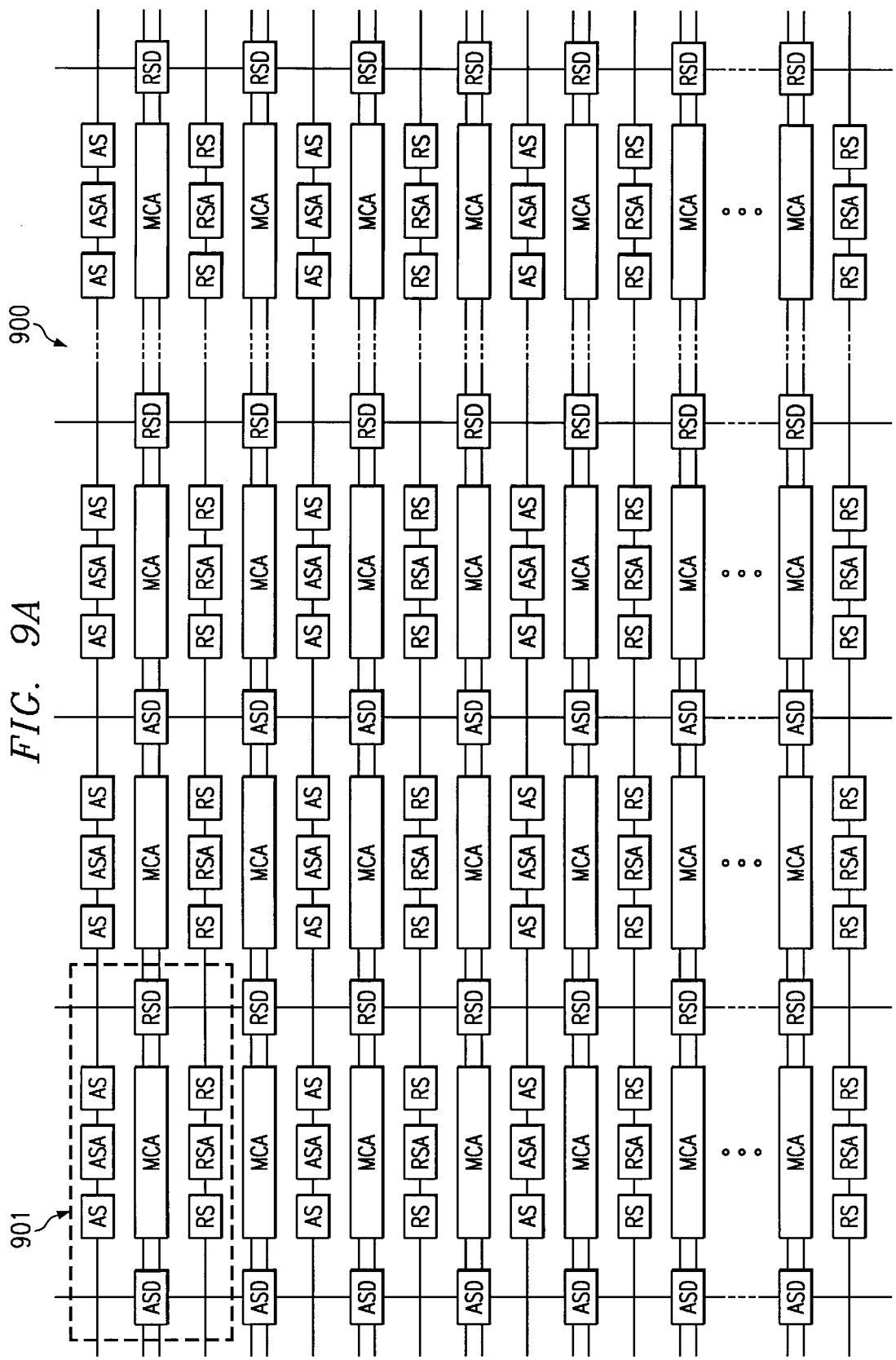
FIG. 9A is a high level functional block diagram of a memory according to the present concepts utilizing blocks of memory circuitry organized into an array.
Figure 9B:
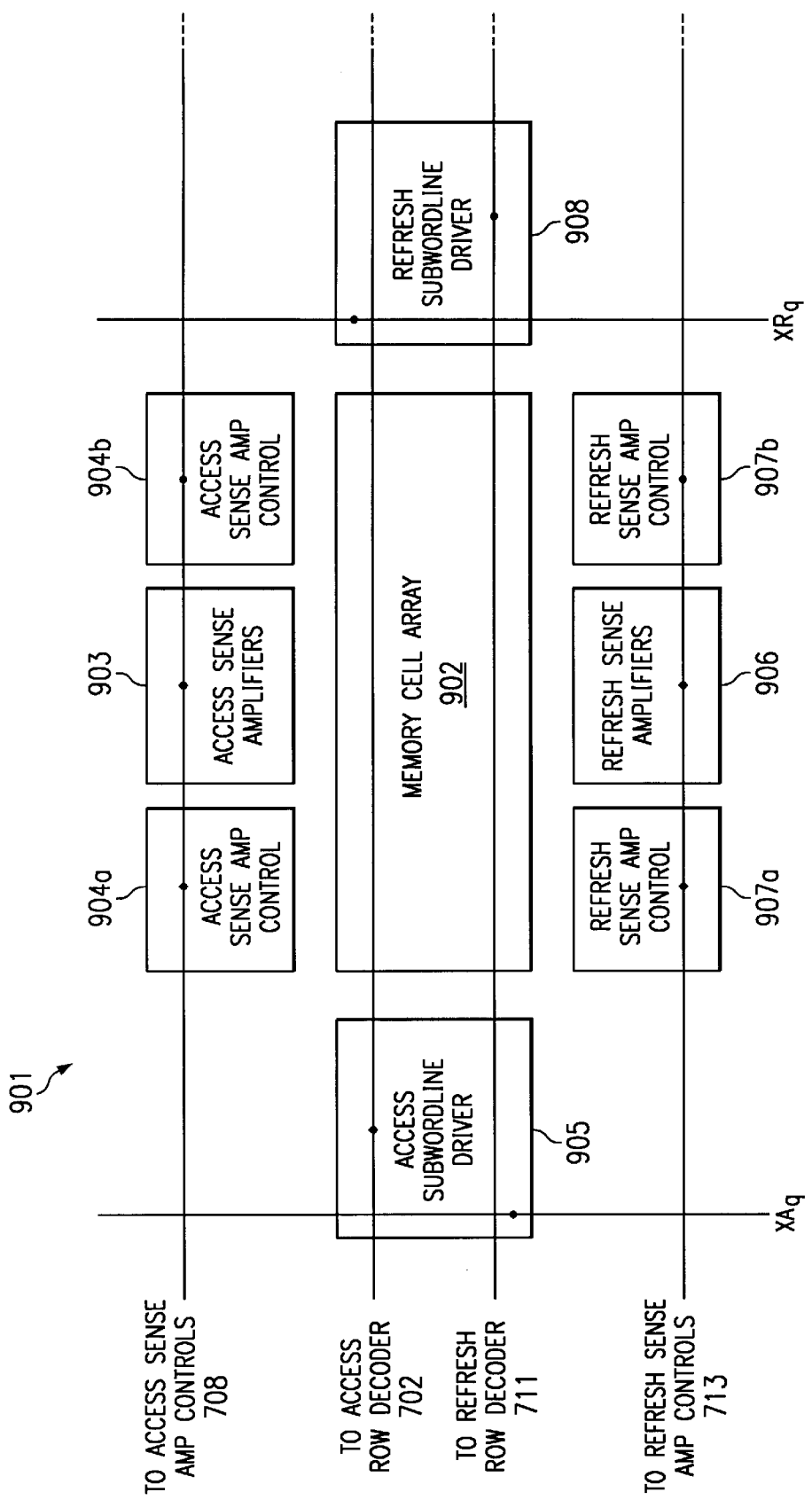
FIG. 9B is a more detailed functional block diagram of a selected one of the blocks of memory circuitry shown in FIG. 9A.

FIG. 9A depicts in detail the partitioning of array 701 into a predetermined number of blocks each including a subarray of cells and accompanying distributed access and refresh circuitry, collectively designated as a subarray 901. The details of each block 901 are shown in FIG. 9B. In this case, assume that array 701 overall is a 16 megabit array which is divided into 64 subarrays organized in 8 rows and 8 columns. Each subarray 901 comprises a 256 kbit cell subarray 902 (FIG. 9B) organized as 1024 rows by 256 columns. The number of address bits consequently required to access each row of array 900 is thirteen (13). The number of column address bits required to access groups of eight (8) columns for a "by 8" embodiment is eight (8) bits. Two sets of access controls are provided in each block 901, one set for location (data) accesses and one set for row refreshes.

The access control circuitry includes access sense amplifiers (ASA) 903 and shunts (AS) 904a and 904b, each of which is coupled to and controlled by access sense amplifier control circuitry 708. Access row selection is effectuated by access subwordline driver (ASD) 905 in response to the selection of a wordline $WL_jB$ and a signal presented on access X-decode line $XA_q$.

The refresh control circuitry includes refresh sense amplifiers (RSA) 906 and refresh shunts (RS) 907a and 907b, each of which is coupled to and controlled by refresh sense amplifier control circuitry 713. Row selection is effectuated by refresh subwordline driver (RSD) 908 in response to the selection of a wordline $WL_jA$ and refresh a X-decode line XRq.

In addition to allowing simultaneous refresh and accesses on a subarray basis, as described above, the embodiment of FIGS. 9A and 9B also advantageously allows for the performance of operations during which only the bitlines of a single block or row of blocks of 901 being accessed and/or refreshed are precharged and equalized. For example, bitlines $BL_iA$ and $BL_iB$ of a single row of blocks can be precharged/equalized and both accesses and row refreshes concurrently performed as discussed above, or the bitlines $BL_iA$ of one row of blocks precharged for refreshes and the bitlines $BL_iB$ of a second row of blocks 901 precharged and used for accesses. In any event, many combinations of accesses and refresh operations are possible since the memory is partitioned into independent subarrays.

Figure 10A:
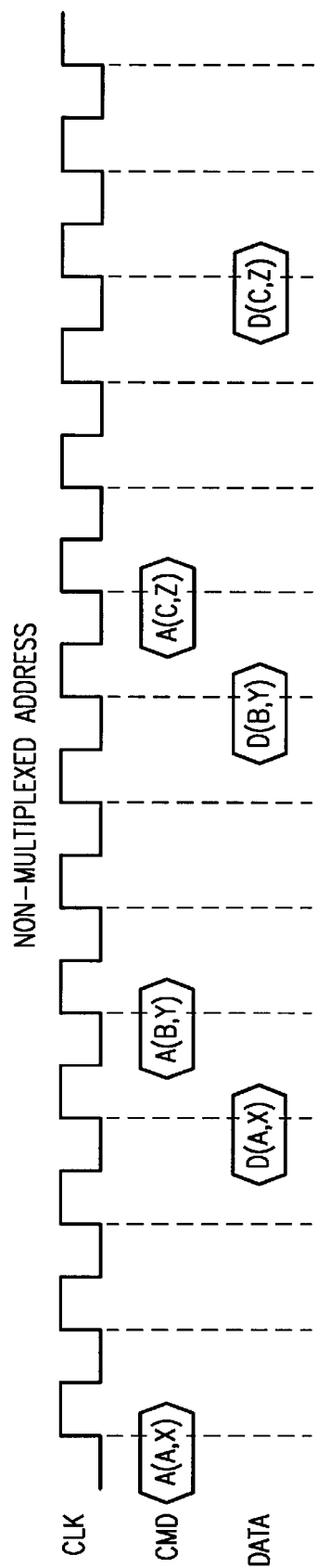
FIG. 10A is a timing diagram depicting the operation of a synchronous dynamic random access memory with a nonmultiplexed address port.
Figure 10B:
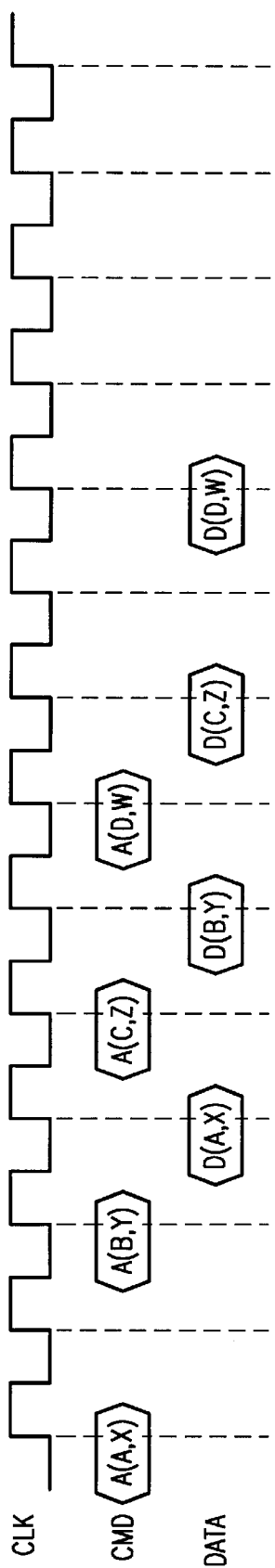
FIG. 10B is a timing diagram depicting the operation of a synchronous dynamic random access memory with a nonmultiplexed address port embodying the principles of the present invention.

The present concepts also allow for low-latency operation of DRAMs with either multiplexed or non-multiplexed address ports. These operations are illustrated in the timing diagrams of FIGS. 10A–10D, with FIGS. 10A and 10B comparing the operation of a conventional SDRAM with a non-multiplexed address port and that of a memory embodying the inventive concepts. In FIGS. 10C and 10D, an SDRAM is again compared against a memory according to the invention, except in this case, a multiplexed address port is considered. For discussion purposes, 2T-1C memories 400 and 700 will be assumed as the memory configurations, although the described low-latency concepts can be applied to other memory configurations and architectures. Additionally, it should be recognized that the timing relationships (e.g. number of clock periods between address inputs, the number of clock periods representing the random cycle time) are exemplary only; the present concepts are applicable to other timing relationships. Also, rising edges have been chosen for reference, although timing off falling edges or voltage levels are also acceptable.

Refer first to FIG. 10A, which shows the operation of an SDRAM with a nonmultiplexed address port CMD. Here, an address to the device can be input on every fourth rising clock edge, with valid data available in response to each address after a delay of three clocks thereafter. Data is effectively available to the system every fourth clock period. Therefore, for a 100 MHZ clock, the fastest rate that data is available is roughly every 40 nanoseconds.

The non-multiplexed embodiment of the present concepts provides data at essentially twice the rate of a conventional SDRAM, as shown in FIG. 10B. Unlike the SDRAM discussed above, addresses are input on every other, instead of every fourth clock edge. As a result, after the first random cycle, data is available every other clock edge.

Addressing a memory, for instance memory 700, in accordance with the invention, at the depicted rate is achieved by interleaving accesses between bitline sets BLA and BLB using wordlines WLA and WLB, respectively. For example, consider the case where the first address depicted is used to access a location using selected bitlines $BL_iA$ along a wordline $WL_jA$. After the access, bitlines $BL_iA$ return to precharge. Two clock edges later, an address is input for accessing a storage location using the bitlines $BL_iB$ and a wordline $WL_jA$. On the following clock edge the data is available in response to the first address. This process continues as long as required. For a 100 MHZ clock, valid data is available every 20 nanoseconds.

A similar increase in data rate is also realized in the multiplexed address port embodiment. As shown in FIG. 10C, in the conventional SDRAM, typical random access works as follows. A row address, input on a corresponding rising edge of the clock. After at least two rising edges later, the column address is clocked into the device. Valid data is finally available on the next rising edge of the clock. Again, the random cycle time is four clock periods. For a 100 MHZ clock after the first random access, random data is available only every 40 nanoseconds.

In the nonmultiplexed address two port embodiment of the present invention, random data is available at twice the rate as a consequence of interleaving accesses between the two sets of bitlines BLA and BLB. On the first rising clock edge, an address to Row A is input to a first port to select a wordline $WL_jA$. Two clock edges later, a column address is input for accessing cells along wordline $WL_jA$ using bitlines $BL_iA$. At the same time, a row address is input to a second port for accessing Row B using a corresponding bitline $BL_iB$. Valid data is available from the addressed cells in Row A on the next rising clock edge. Next, the column address to Row B is input to the second port along with a new row address on the first port to select a row (Row C) using the corresponding wordline $WL_kA$. The data from Row B is accessed, and the cycle continues with the input on the first port of the column address to Row C (bitlines $BL_iA$) This process continues, with random data available at twice the rate of a conventional SDRAM.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It is therefore contemplated that the claims will cover any such modifications or embodiment that fall within the true scope of the invention.

What is claimed is:

1. A memory comprising:
   an array of rows and columns of dynamic memory cells, said cells of each said row coupled to an access wordline and a refresh wordline and said cells of each said column coupled to an access bitline and a refresh bitline, said access and refresh bitlines being independently prechargeable;
   refresh circuitry for refreshing a selected one of said rows of cells using a corresponding refresh wordline and a corresponding refresh bitline;
   access circuitry for accessing selected cells of a selected one of said rows of cells using a corresponding one of said access wordlines and corresponding one of said access bitlines, said access circuitry comprising:
      a new address detector for detecting receipt of a new address by said memory;
      a row decoder for selecting said access wordline in response to receipt of said new address;
      access sense amplifiers and an access column decoder for accessing at least one cell along said selected access wordline using said corresponding access bitline; and
   precharging circuitry for precharging said access bitlines concurrent with refreshing of a said row of cells using a corresponding refresh bitline and precharging said refresh bitlines concurrent with accessing selected cells of a selected one of said rows using corresponding ones of said access bitlines.

2. The memory of claim 1 wherein said refresh circuitry comprises a comparator for comparing at least a portion of said new address with a refresh address and selectively enabling refresh of one of said rows of cells selected by said refresh address in response.

3. The memory of claim 1 wherein said memory cells comprise 2-transistor, 1-capacitor memory cells.

4. The memory of claim 1 wherein said refresh circuitry comprises:
   a refresh row decoder for selecting a refresh row in response to a refresh address;
   a refresh address generator for generating said refresh address; and
   a comparator for comparing said refresh address with said new address and selectively enabling refresh of said selected refresh row in response.

5. The memory of claim 4 wherein refresh of said selected refresh row is enabled when said refresh address and said new address do not match.

6. An information storage device comprising:
   a plurality of memory cells organized in rows and columns, each cell including a first transistor for coupling a storage capacitor of said cell with a first data line of a column of cells containing said cell in response to a signal applied via a first control line of a row of cells containing said cell and a second transistor for coupling said capacitor with a second data line of said column of cells in response to a signal applied via a second control line of said row of cells;
   access circuitry operable in response to a first time base to:
      detect the receipt of an access address addressing a cell being accessed;
      decode said address to activate said first control line of the row containing a cell being accessed; and
      exchange data with said cell being accessed via said first data line of the column containing said cell;
   refresh circuitry operable in response to a second time base to:
      generate a refresh address addressing a cell being refreshed;
      compare said refresh address with said access address; and
      when said refresh address and said access address do not match, refresh the cell being refreshed via said second control line of said row containing said cell; and
   precharge circuitry operable to precharge the first data line in response to the first time base and to precharge the second data line in response to the second time base.

7. The storage device of claim 6 wherein said first and second transistors comprise field effect transistors.

8. The storage device of claim 7 wherein said field effect transistors comprise n-channel field effect transistors.

9. The storage device of claim 7 wherein said access circuitry comprises:
   a new address detection circuitry for detecting receipt of said new address;
   an access row decoder for decoding row address bits comprising a part of said new address and selecting said first control line of said row containing said cell being accessed; and
   a column decoder for decoding column address bits of said new address and accessing said cell being accessed using said first data line of said column of cells containing said cell being accessed.

10. The storage device of claim 7 wherein said refresh circuitry comprises:
    a refresh generator for generating said refresh address;
    a refresh row decoder for decoding said refresh address and in response activating said second control line of said row containing said cell to be refreshed;
    refresh sense amplifiers for sensing and restoring said cell to be refreshed via said second data line of said column containing said cell to be refreshed.

11. The storage device of claim 7 wherein said access circuitry includes circuitry for independently controlling precharge of said first data lines.

12. The storage device of claim 7 wherein said refresh circuitry includes circuitry for independently controlling precharge of said second data lines.

13. The storage device of claim 7 wherein said access circuitry operates on a first time base and said refresh circuitry operates on a second time base.

14. A memory system comprising:
    a plurality of blocks of data storage circuitry comprising:
       an subarray of 2-transistor, 1-capacitor memory cells disposed in rows and columns, a first transistor of each cell selectively coupling a cell storage capacitor with a first bitline of a corresponding column in response to activation of a first subwordline of a corresponding row and a second transistor of each cell selectively coupling the cell storage capacitor with a second bitline of the corresponding column in response to activation of a second subwordline of the corresponding row;
       an access subwordline driver for selecting the first subwordlines of the subarray;
       access sense amplifiers for accessing cells via the first bitlines of the subarray;
       a refresh subwordline driver for accessing the second subwordlines of the subarray; and refresh sense amplifiers for refreshing cells via the second bitlines of the subarray;

access row decoder circuitry for selecting an access subwordline driver in response to an access address;

refresh row decoder circuitry for selecting a refresh subwordline driver in response to a refresh address; and a refresh address generator for generating the refresh address; and precharge circuitry for precharging the first and second bitlines of the subarray receptively in response to first and second independent time bases.

15. The memory system of claim 14 wherein said plurality of refresh addresses are sequential.

16. The memory system of claim 14 wherein said blocks of memory cells are organized as an array of rows and columns.

17. The memory system of claim 16 and further comprising circuitry for selectively controlling precharge and active cycles of said blocks on a row by row basis.

18. A method for operating a memory, the memory including a plurality of memory cells, each cell including a first transistor for coupling a storage capacitor of the cell with a first data line of a column of cells containing the cell in response to a signal applied via a first control line of a row of cells containing the cell and a second transistor for coupling the storage capacitor with a second data line of the column of cells in response to a signal applied via a second control line of the row of cells, comprising the steps of:

accessing a cell comprising the substeps of:
detecting the receipt of an access address addressing a cell being accessed;
decoding the address to activate the first control line of a row containing the cell being accessed; and
exchanging data with the cell being accessed via the first data line of a column containing the cell being accessed; and substantially simultaneously with said step of accessing, refreshing another cell comprising the substeps of:
generating a refresh address addressing at least one cell being refreshed;
comparing the refresh address with the access address; and
when the refresh address and the access address do not match, refreshing the cell being refreshed via the second control line of the row containing the cell being refreshed and the second bitline of the column of cells containing the cell being refreshed; and selectively precharging the first and second bitlines, wherein said steps of accessing and precharging the first bitline are performed timed by a first time base and said steps of refreshing and precharging the second bitlines are performed timed by a second time base.

19. A method of operating a low-latency memory comprising an array of rows and columns of two-transistor, one-capacitor dynamic random access memory cells, the cells of each column associated with first and second independently prechargeable bitlines and the cells of each row associated with first and second wordlines, the method comprising the steps of:

presenting first address bits to the memory in response to a first clock edge for accessing a first location in the array using the first wordline and the first bitline of the corresponding row and column;

presenting second address bits to the memory in response to a second clock edge a preselected number of clock periods after the first edge for accessing a second location in the array using the second wordline and the second bitline of the corresponding row and column; and after said step of presenting the second address bits, accessing the first location on a third clock edge a preselected number of clock periods after the second edge.

20. The method of claim 19 wherein the first address bits comprise row address bits and the second address bits comprise column address bits.

21. The method of claim 19 wherein the first and second address bits comprise both row and column address bits.

22. The method of claim 19 wherein said steps of presenting are performed substantially simultaneously.

23. The method of claim 22 wherein the first address bits comprise row address bits and the second address bits comprise column address bits.

24. The method of claim 19 and further comprising the step of substantially simultaneously with said step of presenting the second address bits presenting third address bits for accessing the location in the array.

25. The method of claim 24 wherein the first address bits comprise row address bits, the second address bits comprise row address bits and the third address bits comprise column address bits.

* * * * *